Feb. 23, 1965 R. L. TRENT 3,171,067

BASE WASHER CONTACT FOR TRANSISTOR AND METHOD
OF FABRICATING SAME

Filed Feb. 19, 1960

INVENTOR

Robert L. Trent

BY Stevens, Davis, Miller & Mosher

ATTORNEYS 3,171,067

BASE WASHER CONTACT FOR TRANSISTOR AND METHOD OF FABRICATING SAME

Robert L. Trent, Dallas, Tex., assignor to Texas Instrument Incorporated, Dallas, Tex., a corporation of Delaware Filed Feb. 19, 1960, Ser. No. 9,852
5 Claims. (Cl. 317—234)

Figure 1:
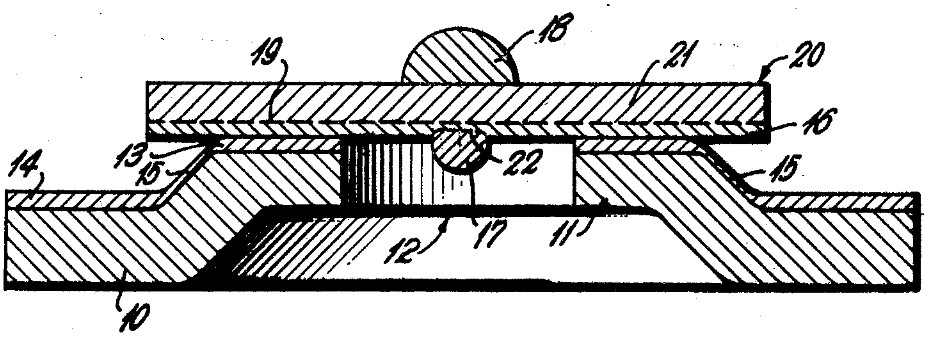

This invention relates to semiconductor devices and more particularly to a unitary support and washer contact structure for mounting a wafer of semiconductor material and to a method for fabricating a semiconductor device using such a contact.

Semiconductor devices employing a thin single crystal of semiconductor material require a rugged and stable structure for supporting the crystal. Frequently, the crystal is attached to a relatively massive support structure by means of an intermediate layer which is bonded or alloyed to both the support structure and the crystal. Since it is of primary importance that the crystal or wafer not be strained during the heating of the assembly to bond the intermediate layer to the wafer, the thermal coefficient of expansion of the support should match fairly closely that of the wafer material. The intermediate layer material is generally present in a very thin layer and therefore its expansion characteristics are not so critical, since it will not unduly stress the wafer during the bonding operation. In selecting the material of the intermediate layer then, the primary considerations are its conductivity, the type of contact formed with the wafer, i.e., ohmic or rectifying, and the ability of the material to alloy with the type of semiconductor material of which the wafer is composed.

To the problems of mechanical strength and attachment of the supporting structure to the semiconductor wafer, there must be added the problem of establishing an ohmic connection to the semiconductor material while scrupulously avoiding the penetration of the bonding material across PN junctions in the wafer.

In U.S. Patent 2,796,563 to Ebers et al., a unitary support and electrical contact structure is disclosed which has high mechanical strength and is capable of being firmly bonded by an ohmic connection to the semiconductor wafer. The Ebers support structure is a flat sheet metal member which has a central portion raised out of the major plane of the sheet metal surface and which has a hole or aperture in the raised central portion through which the emitter portion of an alloyed junction semiconductor device may project. The support member is coated on its upper surface with a material which will form a low temperature eutectic with the semiconductor material of the wafer, thus permitting the support member to be strongly bonded to the wafer without the application of intense heat. The coating material is either of a type which will itself form an ohmic connection to the particular semiconductor material used, or it may be a material which has been doped with appropriate donor or acceptor impurities in order to provide such a connection.

The material utilized to attach the support structure, or washer, as it will hereinafter be termed, to the wafer is described in the Ebers patent as being coated on the support structure by a plating process. Also, the Ebers washer is described and depicted as being used primarily with alloyed-type semiconductor devices.

The support structure of the present invention is in the form of a washer like that described in the Ebers patent, but is of an improved design which affords several advantages over prior art devices of the Ebers type. These advantages are most obviously manifested in the application of the washer of this invention to use as a base contact in small diffused junction type high frequency devices. It is this type of application which will be described in pointing out the novel features of the invention and the advantages over prior art devices which accrue therefrom, although the washer supporting structure claimed may be utilized in other types of devices, including alloyed junction devices, and may also be used for a collector or emitter contact where design considerations warrant such use.

In diffused junction semiconductor devices, it is generally true that the junction formed by diffusion exists very close to the surface of the semiconductor wafer. In forming contacts to such a surface, extreme care must be exercised to avoid shorting across the junction and thereby rendering the device defective. The depth to which the eutectic formed between an intermediate bonding material and the wafer material advances is extremely critical and, therefore, excess of such bonding material over the minimum amount needed to bond to the wafer must be scrupulously avoided. In addition, the amount of the intermediate bonding material must be carefully controlled to prevent any excess bonding material flowing up the sides of the semiconductor wafer and thereby shorting the diffused junction.

In prior art washer devices, the bonding material has been plated upon the base metal of the washer and, in many cases, the entire surface of the washer has been covered by the plated material. Such construction gives rise to several disadvantages which lessen the suitability of such washers for use in diffused devices. Thus, for example, gold plating, when used, has a diffusion speed which renders difficult the control of the depth to which the gold-semiconductor eutectic progresses in the wafer. Furthermore, where the entire surface of the washer has been plated, plastic flow of the plated material during heating to form the eutectic may result in an overlapping of the junction with consequent shorting. The sides of the washer upon which the gold is plated present zones which act as sources of flowing bonding material and contribute to the shorting of the device junctions by the formation of fillets where the washer is bonded to the wafer. Moreover, the presence of plating on the underside of the washer, as well as on the surface adjacent the wafer, makes it more difficult to attach the washer to support means by welding techniques.

In prior art washers where an attempt is made to limit the plating to an area on the top surface of the raised portion of the washer and thus to limit the amount of material which is available to form the eutectic, the difficulty of closely controlling the plating action renders such an operation costly and time-consuming.

The support washer of the present invention constitutes an improvement over the washers of the prior art in that most of the disadvantages which have been mentioned are obviated, and the washer is therefore especially suited for use as a contact-support structure in semiconductor devices. Broadly, the washer of this invention comprises a metal washer clad with a material which forms a low-melting eutectic with the semi-conductor wafer. The washer has an apertured central portion raised out of the major plane of the metal surface. The tooling used to provide the aperture and raised section is dimensioned so that an annular band of the material-clad surface of the washer is decreased considerably in thickness, thereby restricting the flow of the clad material which occurs when the washer and wafer are heated to bond the wafer to the washer. Thus, the use of cladding and coining techniques provide considerable improvement over the plating techniques of the prior art in that the depth to which the eutectic formed will advance in the semiconductor wafer may be controlled, the tendency for the clad material to flow to the extent the junction is shorted is substantially reduced, and the washer contacts can be mass produced. A variety of materials may be employed for cladding the base metal of the washer.

It is accordingly an object of the present invention to provide a washer contact which may be attached to a junction semiconductor device.

It is a further object of the present invention to provide a washer contact for attachment to a semiconductor wafer, which washer is clad with a material which bonds well with the semiconductor wafer material.

Another purpose of the novel washer contact construction of the present invention is to permit better control of the flow of the molten eutectic formed between the washer bonding material and the semiconductor wafer.

An additional object of this invention is to provide a washer contact which is clad with a material for establishing a bond to a semiconductor wafer, which clad material is present in an amount which reduces the possibility of defective fabrication due to shorting of the junctions of the wafer.

A further object of this invention is to provide an improved washer contact which may be mass produced and does not require a brush plating or manual tinning operation in its fabrication.

These and other objects, advantages, and features of this invention will be better understood and more fully appreciated from the following detailed description when read with reference to the two figures in the application which are views in cross section of the novel washer of the invention after it has been bonded to a diffused-junction semiconductor wafer.

Figure 2:
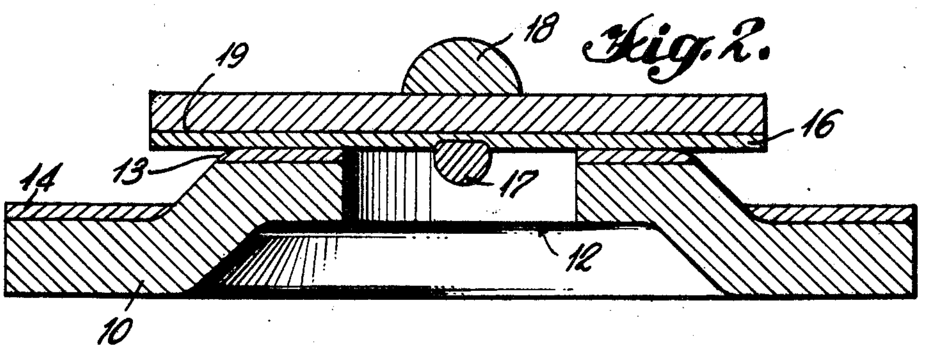

In the figures, the numeral 10 designates a sheet metal washer which has a centrally located raised portion 11 formed out of the major plane of the metal sheet. The raised portion defines a circular aperture 12. A material which forms a low-melting eutectic with the semiconductor wafer material is clad upon the upper surface of the sheet metal, as shown at 13, and also upon the upper surface of the portion of the sheet metal which resides in the major plane of the washer, as shown at 14. The tooling used to provide the raised portion 11 and aperture 12 is so dimensioned that the thickness of the clad material present in the circumferential band 15 is reduced considerably or, ideally, the clad material is removed completely from the band 15 as shown in FIG. 2.

A semiconductor wafer 20 having a diffused base 16 is mounted upon the clad material 13 over the raised portion 11 of the sheet metal. An alloyed emitter contact 17 extends from the under side of the wafer into the aperture in the washer, and a collector contact 18 is attached to the upper surface of the collector region 21. The base-collector junction is indicated by the dashed line 19, and the base-emitter junction is indicated by the dashed line 22.

In the semiconductor device depicted, the washer 10 forms the base contact. The base region 16 is formed by diffusing donor or acceptor impurities into one surface of the wafer in a manner well known to the prior art. The base-collector junction 19 in such a diffused device is often within 0.2 to 0.4 mil of the surface of the wafer. It is essential that the bonding material used to affix the washer to the wafer not penetrate through the base region 16 and short-circuit the junction 19. It is equally important that the bonding material not flow along the surface of the wafer 20 to such an extent as to short either the junction 19 or the junction 22. The washer design of the present invention effectively prevents shorting of the junctions, as will be hereinafter explained.

As has been pointed out, the base metal of the washer should ideally have a coefficient of thermal expansion substantially the same as that of the semiconductor wafer. However, it may be necessary to use other materials to obtain good thermal conductivity. The centrally raised portion provides sufficient stiffness and flatness over the contact area to prevent undue stress in the semiconductor wafer during the bonding operation due to differences between the coefficients of thermal expansion of the wafer and the base metal of the washer. The base metal of the washer can be, for example, Kovar, tungsten, nickel, molybdenum, and tantalum, to mention a few. Any one of these may be utilized in fabricating the sheet metal portion of the washer of the present invention.

It has also been pointed out above that in selecting the material to be used as an intermediate bonding substance between the base metal of the washer and the wafer, consideration must be given to the necessity that the substance form a low-melting eutectic with the wafer material, that it be capable of being firmly bound in some manner to the base metal, and that it form an ohmic connection with the wafer, or alternatively, that it may easily be modified so that it will form such a connection.

An alloy containing from 60% to 95% tin and from 40% to 5% lead has been found to be an especially suitable material which meets all these requirements and, for purposes of explanation and example, it will be assumed that the clad material 13 and 14 of the base washer depicted is such an alloy. The clad layer is from 2% to 10% the thickness of the base metal of the washer, which typically is 5 to 10 mils in thickness.

Instead of plating the bonding material upon the base metal of the washer over the entire external surface or over a localized area restricted to the top surface of the raised portion of the washer, or manually tinning the localized area, as has been done in the case of prior art washers, an important feature of the present invention resides in the use of known cladding techniques to superform a controllable layer of material upon one surface of the base metal prior to the tooling and processing operations required to obtain the physical conformation desired. By such a technique, a very thin and very uniform film of bonding material may initially be positioned on the upper surface of the washer. The dimensions of the punching, forming, and coining tooling are controlled to achieve the desired flatness over the contact area between bonding material and semiconductor wafer. To further restrict the total volume of clad material which is contiguous to the bonding area to the minimum amount required to establish a strong bond, the tooling forms a circumferential band of reduced thickness 15 of cladding material on the sides of the raised portion of the washer. This circumferential reduction of the thickness of the clad material aids in preventing short-circuiting of the base-collector junction 19 in two ways.

First, the reduction in the thickness of the clad material limits the supply of clad material which is available to overlap the ends or sides of the wafer in the course of heating, and thus externally to short across the base-collector junction. In this connection, it should be pointed out that, as a consequence of the reduction in the thickness of the clad material along the sides of the circumferential band, there is a tendency of the clad material to separate in the thinned area when the heating of the unit to bond the washer to the wafer is carried out.

Secondly, the displacement of that portion of the clad material which is located on the upper surface of the raised portion of the washer from the remainder of the clad material permits the thickness, area, and total volume of the former to be closely and accurately controlled. Such control is, of course, closely related to control of the depth to which the eutectic formed on the bonding will advance into the semiconductor wafer.

It has further been found that the use of a clad material for bonding the washer to the wafer is preferable to the use of plated material for a number of reasons. First, the characteristics of the clad material are such that the liquid eutectic is more easily controlled.

Moreover, where a cladding process followed by a coining operation to form the clad band of reduced thickness is utilized, the washer contacts may be mass produced with the elimination of brush plating or manual tinning operations, and the only expense involved is in supplying the washer materials and the initial cost of tooling.

Finally, the thickness of the clad layer may be more accurately and uniformly controlled than in the case of plating, and as a result of this control, more uniform bonding between washer and wafer is obtainable.

Although the type of washer described and depicted hereinabove is considered a preferred embodiment of the invention, it will be appreciated that other arrangements are possible which do not depart from the novel concepts herein taught. Thus, various other changes and modifications such as are obvious to one skilled in the art are deemed to be within the spirit, scope, and contemplation of the present invention.

What is claimed is:

1. In a semiconductive device, a semiconductor member having a base, a base contact comprising a metallic washer having a central mesa-shaped portion defining a central aperture in said washer, a first portion of bonding material clad to the upper surface of the top of said mesa-shaped portion and forming an ohmic connection to said base, a second portion of said bonding material clad to said washer and spaced apart from said first region and a third portion of said bonding material located between said first and second portions and of lesser thickness than said first and second portions whereby a thin circumferential band of clad material is defined between said first and second portions.

2. An electrical contact for use in a semiconductive device comprising a sheet metal washer of substantially the same coefficient of expansion as the semiconductor wafer to which it is to be attached and having a mesa-shaped central portion projecting from the major plane of said washer, a first portion of clad material bonded to the top of said mesa, and a second portion of clad material bonded to the portion of said washer forming its major plane, said first portion and said second portion of clad material being separated from each other by a circumferential band which is free of clad material.

3. A method of fabricating a semiconductor device which comprises cladding a base material, forming a mesa-shaped washer from said base material while reducing the thickness of the clad material in a circumferential band extending around the side of the mesa, and bonding a semiconductor element to the clad material at the top of said mesa.

4. In a diffused base semiconductive device, a base contact comprising a metallic washer having a coefficient of expansion of substantially the same value as that of the semi-conductive wafer of said semiconductive device, said contact having a central mesa-shaped portion defining a central aperture in said washer, a first portion of bonding material clad to the upper surface of the top of said mesa and forming an ohmic connection to said diffused base, a second portion of said bonding material clad to said washer and spaced apart from said first region whereby a circumferential band of unclad metal on the side of said mesa is defined between said first and second portions of bonding material.

5. An electrical contact for use in a semiconductive device comprising a metallic washer having a central mesa-shaped portion defining a central aperture in said washer, a first portion of bonding material clad to the upper surface of the top of said mesa-shaped portion, a second portion of said bonding material clad to said washer and spaced apart from said first portion, and a third portion of said bonding material located between said first and second portions and being of a lesser thickness than said first and second portions whereby a thin circumferential band of clad material is defined between said first and second portions.

References Cited in the file of this patent

UNITED STATES PATENTS

| | | |
|---|---|---|
| 2,796,563 | Ebers et al. | June 18, 1957 |
| 2,862,115 | Ross | Nov. 25, 1958 |
| 2,922,092 | Gazzara et al. | Jan. 19, 1960 |
| 2,947,923 | Pardue | Aug. 2, 1960 |

FOREIGN PATENTS

| | | |
|---|---|---|
| 821,551 | Great Britain | Oct. 7, 1959 |

OTHER REFERENCES

Metal Handbook, ASM, vol. 1, 8th edition, 1961, page 8.